(12) United States Patent
Carta et al.

(10) Patent No.: US 9,419,092 B2
(45) Date of Patent: Aug. 16, 2016

(54) TERMINATION FOR SIC TRENCH DEVICES

(75) Inventors: Rossano Carta, Turin (IT); Laura Bellemo, Turin (IT)

(73) Assignee: Vishay-Siliconix, Santa Clara, CA (US)

( * ) Notice: Subject to any disclaimer, the term of this patent is extended or adjusted under 35 U.S.C. 154(b) by 1610 days.

(21) Appl. No.: 11/365,291

(22) Filed: Mar. 1, 2006

(65) Prior Publication Data

US 2006/0214242 A1 Sep. 28, 2006

Related U.S. Application Data

(60) Provisional application No. 60/658,789, filed on Mar. 4, 2005.

(51) Int. Cl.
| | |
|---|---|
| *H01L 29/15* | (2006.01) |
| *H01L 29/66* | (2006.01) |
| *H01L 29/06* | (2006.01) |
| *H01L 29/16* | (2006.01) |
| *H01L 29/40* | (2006.01) |
| *H01L 29/423* | (2006.01) |
| *H01L 29/808* | (2006.01) |

(52) U.S. Cl.
CPC ...... *H01L 29/66068* (2013.01); *H01L 29/0619* (2013.01); *H01L 29/0661* (2013.01); *H01L 29/1608* (2013.01); *H01L 29/402* (2013.01); *H01L 29/42312* (2013.01); *H01L 29/8083* (2013.01)

(58) Field of Classification Search
CPC ............... H01L 29/66068; H01L 29/0619; H01L 29/0661; H01L 29/1608; H01L 29/402; H01L 29/42312; H01L 29/8083

USPC ............... 257/409, 77, 496, 510, 626, 630
See application file for complete search history.

(56) References Cited

U.S. PATENT DOCUMENTS

| | | | |
|---|---|---|---|
| 4,036,672 A | 7/1977 | Kobayashi | |
| 4,206,540 A | 6/1980 | Gould | |
| 4,648,175 A | 3/1987 | Metz, Jr. et al. | |
| 4,796,084 A | 1/1989 | Kamasaki et al. | |
| 4,862,244 A | 8/1989 | Yamagishi | |
| 4,990,994 A | 2/1991 | Furukawa et al. | |
| 5,003,372 A | 3/1991 | Kim et al. | |
| 5,047,833 A | 9/1991 | Gould | |
| 5,113,237 A | 5/1992 | Stengl | |
| 5,233,215 A * | 8/1993 | Baliga | 257/490 |
| 5,323,040 A | 6/1994 | Baliga | |
| 5,362,975 A | 11/1994 | von Windheim et al. | |
| 5,384,470 A | 1/1995 | Tachibana et al. | |

(Continued)

FOREIGN PATENT DOCUMENTS

| | | |
|---|---|---|
| DE | 19840032 | 11/1999 |
| DE | 10002362 A1 | 8/2001 |

(Continued)

OTHER PUBLICATIONS

Translation of a portion of the Office Action for Japanese Patent Application No. 2004-306311.

(Continued)

*Primary Examiner* — H Tsai

(57) ABSTRACT

A silicon carbide device has a termination region that includes a mesa region that links the termination region to an active area of the device and that includes one or more trenches.

26 Claims, 4 Drawing Sheets

(56) References Cited

U.S. PATENT DOCUMENTS

| | | | |
|---|---|---|---|
| 5,527,745 A | 6/1996 | Dixit et al. | |
| 5,689,128 A | 11/1997 | Hshieh et al. | |
| 5,712,502 A | 1/1998 | Mitlehner et al. | |
| 5,747,831 A | 5/1998 | Loose et al. | |
| 5,753,938 A | 5/1998 | Thapar et al. | |
| 5,789,311 A | 8/1998 | Ueno et al. | |
| 5,801,836 A | 9/1998 | Bakowski et al. | |
| 5,914,500 A | 6/1999 | Bakowski et al. | |
| 5,915,179 A | 6/1999 | Etou et al. | |
| 5,932,894 A | 8/1999 | Bakowski et al. | |
| 5,977,605 A | 11/1999 | Bakowsky et al. | |
| 6,040,237 A | 3/2000 | Bakowski et al. | |
| 6,040,600 A | 3/2000 | Uenishi et al. | |
| 6,040,617 A | 3/2000 | Patel | |
| 6,100,572 A | 8/2000 | Kinzer | |
| 6,150,246 A | 11/2000 | Parsons | |
| 6,177,712 B1 * | 1/2001 | Miyasaka | 257/484 |
| 6,207,591 B1 | 3/2001 | Aoki et al. | |
| 6,229,194 B1 | 5/2001 | Lizotte | |
| 6,303,986 B1 | 10/2001 | Shook | |
| 6,320,205 B1 | 11/2001 | Pfirsch et al. | |
| 6,353,252 B1 | 3/2002 | Yasuhara et al. | |
| 6,362,495 B1 | 3/2002 | Schoen et al. | |
| 6,373,076 B1 | 4/2002 | Alok et al. | |
| 6,410,958 B1 | 6/2002 | Usui et al. | |
| 6,432,750 B2 | 8/2002 | Jeon et al. | |
| 6,441,455 B1 | 8/2002 | Dutta | |
| 6,498,368 B2 | 12/2002 | Sakamoto et al. | |
| 6,509,240 B2 | 1/2003 | Ren et al. | |
| 6,514,782 B1 | 2/2003 | Wierer, Jr. et al. | |
| 6,562,647 B2 | 5/2003 | Zandman et al. | |
| 6,573,534 B1 | 6/2003 | Kumar et al. | |
| 6,573,537 B1 | 6/2003 | Steigerwald et al. | |
| 6,586,801 B2 | 7/2003 | Onishi et al. | |
| 6,605,862 B2 | 8/2003 | Van Dalen et al. | |
| 6,621,122 B2 | 9/2003 | Qu | |
| 6,622,380 B1 | 9/2003 | Grigg | |
| 6,624,522 B2 | 9/2003 | Standing et al. | |
| 6,630,698 B1 | 10/2003 | Deboy et al. | |
| 6,635,944 B2 | 10/2003 | Stoisiek | |
| 6,673,662 B2 | 1/2004 | Singh | |
| 6,674,126 B2 | 1/2004 | Iwamoto et al. | |
| 6,683,347 B1 | 1/2004 | Fujihira | |
| 6,700,141 B2 | 3/2004 | Iwamoto et al. | |
| 6,713,813 B2 | 3/2004 | Marchant | |
| 6,740,931 B2 | 5/2004 | Kouzuki et al. | |
| 6,762,455 B2 | 7/2004 | Oppermann et al. | |
| 6,764,906 B2 | 7/2004 | Darwish | |
| 6,768,170 B2 | 7/2004 | Zhou | |
| 6,791,167 B2 | 9/2004 | Hayashi et al. | |
| 6,812,282 B2 | 11/2004 | Chang et al. | |
| 6,828,609 B2 | 12/2004 | Deboy et al. | |
| 6,844,571 B2 | 1/2005 | Krames et al. | |
| 6,849,900 B2 | 2/2005 | Aida et al. | |
| 6,897,133 B2 | 5/2005 | Collard | |
| 6,936,850 B2 | 8/2005 | Friedrichs et al. | |
| 6,949,454 B2 | 9/2005 | Swanson et al. | |
| 6,960,829 B2 | 11/2005 | Hogerl | |
| 6,979,862 B2 | 12/2005 | Henson | |
| 6,992,340 B2 | 1/2006 | Tanaka | |
| 7,034,376 B2 * | 4/2006 | Okada et al. | 257/471 |
| 7,073,890 B2 | 7/2006 | Cabal et al. | |
| 7,166,890 B2 | 1/2007 | Sridevan | |
| 7,173,284 B2 | 2/2007 | Kumar et al. | |
| 7,262,434 B2 | 8/2007 | Okamura et al. | |
| 7,265,045 B2 | 9/2007 | Lee et al. | |
| 7,265,388 B2 | 9/2007 | Fukuda et al. | |
| 7,299,538 B2 | 11/2007 | Tactic-Lucic | |
| 7,315,081 B2 | 1/2008 | Standing | |
| 7,394,158 B2 | 7/2008 | Carta et al. | |
| 7,411,218 B2 | 8/2008 | Seng et al. | |
| 7,492,003 B2 | 2/2009 | Kinzer | |
| 7,507,650 B2 | 3/2009 | Nakamura et al. | |
| 7,649,213 B2 | 1/2010 | Hatakeyama et al. | |
| 7,687,907 B2 | 3/2010 | Okuda et al. | |
| 7,718,470 B2 | 5/2010 | Hsu | |
| 7,777,292 B2 | 8/2010 | Ota et al. | |
| 7,812,441 B2 | 10/2010 | Carta et al. | |
| 7,834,376 B2 | 11/2010 | Carta et al. | |
| 8,368,165 B2 | 2/2013 | Richieri | |
| 8,368,211 B2 | 2/2013 | Standing et al. | |
| 8,368,223 B2 | 2/2013 | Standing | |
| 2001/0043172 A1 | 11/2001 | McGrath et al. | |
| 2001/0052601 A1 | 12/2001 | Onishi et al. | |
| 2002/0063281 A1 | 5/2002 | Tihanyl | |
| 2002/0064930 A1 | 5/2002 | Ishikawa | |
| 2002/0076851 A1 | 6/2002 | Eden et al. | |
| 2002/0109211 A1 | 8/2002 | Shinohara | |
| 2002/0171087 A1 | 11/2002 | Krames et al. | |
| 2002/0179909 A1 | 12/2002 | Uchida et al. | |
| 2003/0006425 A1 | 1/2003 | Bol et al. | |
| 2003/0042538 A1 | 3/2003 | Kumar et al. | |
| 2003/0075783 A1 | 4/2003 | Yoshihara et al. | |
| 2003/0127747 A1 | 7/2003 | Kajiwara et al. | |
| 2003/0162355 A1 | 8/2003 | Sankin et al. | |
| 2003/0176031 A1 | 9/2003 | Onishi et al. | |
| 2003/0183895 A1 | 10/2003 | Okamura et al. | |
| 2004/0012930 A1 | 1/2004 | Grigg | |
| 2004/0051118 A1 | 3/2004 | Bruhns et al. | |
| 2004/0063240 A1 | 4/2004 | Madrid et al. | |
| 2004/0070060 A1 | 4/2004 | Mamitsu et al. | |
| 2004/0104489 A1 | 6/2004 | Larking | |
| 2004/0110330 A1 | 6/2004 | Collard | |
| 2004/0113264 A1 | 6/2004 | Akerling et al. | |
| 2004/0135178 A1 | 7/2004 | Onose et al. | |
| 2004/0145380 A1 | 7/2004 | Babcock et al. | |
| 2004/0150040 A1 | 8/2004 | Nitta et al. | |
| 2004/0169262 A1 | 9/2004 | Oliver et al. | |
| 2004/0207092 A1 | 10/2004 | Burrell et al. | |
| 2004/0212011 A1 | 10/2004 | Ryu | |
| 2004/0212093 A1 | 10/2004 | Chopra et al. | |
| 2004/0245570 A1 | 12/2004 | Ninomiya | |
| 2004/0262685 A1 | 12/2004 | Zingg | |
| 2005/0012143 A1 | 1/2005 | Tanaka et al. | |
| 2005/0023680 A1 | 2/2005 | Wang et al. | |
| 2005/0029557 A1 | 2/2005 | Hatakeyama et al. | |
| 2005/0034888 A1 | 2/2005 | Hoffmann et al. | |
| 2005/0067630 A1 | 3/2005 | Zhao | |
| 2005/0072984 A1 | 4/2005 | Kwak et al. | |
| 2005/0077615 A1 | 4/2005 | Yu et al. | |
| 2005/0082570 A1 | 4/2005 | Sridevan | |
| 2005/0082611 A1 * | 4/2005 | Peake et al. | 257/341 |
| 2005/0091988 A1 | 5/2005 | Stewart et al. | |
| 2005/0139947 A1 * | 6/2005 | Okada et al. | 257/480 |
| 2005/0200011 A1 | 9/2005 | Standing et al. | |
| 2005/0230715 A1 | 10/2005 | Hoshino et al. | |
| 2005/0253168 A1 | 11/2005 | Wu et al. | |
| 2006/0003514 A1 | 1/2006 | Richieri | |
| 2006/0065899 A1 | 3/2006 | Hatakeyama et al. | |
| 2006/0086939 A1 * | 4/2006 | Carta et al. | 257/77 |
| 2006/0145283 A1 | 7/2006 | Zhu et al. | |
| 2006/0220027 A1 | 10/2006 | Takahashi et al. | |
| 2006/0226504 A1 * | 10/2006 | Hatakeyama et al. | 257/472 |
| 2006/0255423 A1 | 11/2006 | Ryu et al. | |
| 2007/0222025 A1 | 9/2007 | Husain et al. | |
| 2007/0228505 A1 * | 10/2007 | Mazzola et al. | 257/471 |
| 2008/0237608 A1 | 10/2008 | Richieri | |
| 2008/0286968 A1 | 11/2008 | Carta et al. | |
| 2009/0067630 A1 | 3/2009 | Daemen et al. | |
| 2009/0104738 A1 | 4/2009 | Ring et al. | |
| 2010/0068855 A1 | 3/2010 | Saxler et al. | |
| 2011/0248284 A1 | 10/2011 | Carta et al. | |
| 2011/0278591 A1 | 11/2011 | Carta et al. | |
| 2014/0042459 A1 | 2/2014 | Richieri | |

FOREIGN PATENT DOCUMENTS

| | | |
|---|---|---|
| EP | 0604194 | 6/1994 |
| EP | 0681326 A2 | 11/1995 |
| EP | 0958923 A2 | 11/1999 |
| EP | 1349202 | 1/2003 |
| EP | 1739753 | 1/2007 |
| EP | 1739753 A1 | 1/2007 |
| FR | 2579023 | 9/1986 |

(56) References Cited

FOREIGN PATENT DOCUMENTS

| | | | |
|---|---|---|---|
| JP | 7302896 | | 11/1995 |
| JP | 09-036393 | | 2/1997 |
| JP | 11087690 | | 3/1999 |
| JP | 11087698 | | 3/1999 |
| JP | 11348355 | | 12/1999 |
| JP | 2000-022178 | | 1/2000 |
| JP | 2001313391 | | 11/2001 |
| JP | 2002-118268 | | 4/2002 |
| JP | 2002158363 | | 5/2002 |
| JP | 2003-74951 | | 6/2002 |
| JP | 2002261295 | | 9/2002 |
| JP | 2003-258271 | | 9/2003 |
| JP | 2003-273127 | * | 9/2003 |
| JP | 2003273127 | | 9/2003 |
| JP | 2004079988 | | 3/2004 |
| JP | 2004-111759 | | 4/2004 |
| JP | 2004099898 | | 4/2004 |
| JP | 2004-221513 | | 8/2004 |
| JP | 2005079339 | | 3/2005 |
| JP | 2005286197 | | 10/2005 |
| JP | 2005-311347 | | 11/2005 |
| JP | 2006-100593 | | 4/2006 |
| WO | 9727626 A1 | | 7/1997 |
| WO | 0038242 | | 6/2000 |
| WO | 0143172 | | 6/2001 |
| WO | 03038906 | | 5/2003 |
| WO | 2006/047382 | | 5/2005 |
| WO | 2005/093840 | | 10/2005 |
| WO | 2005091988 | | 10/2005 |

OTHER PUBLICATIONS

International Search Report for PCT/US05/38118 dated Feb. 6, 2007.

* cited by examiner

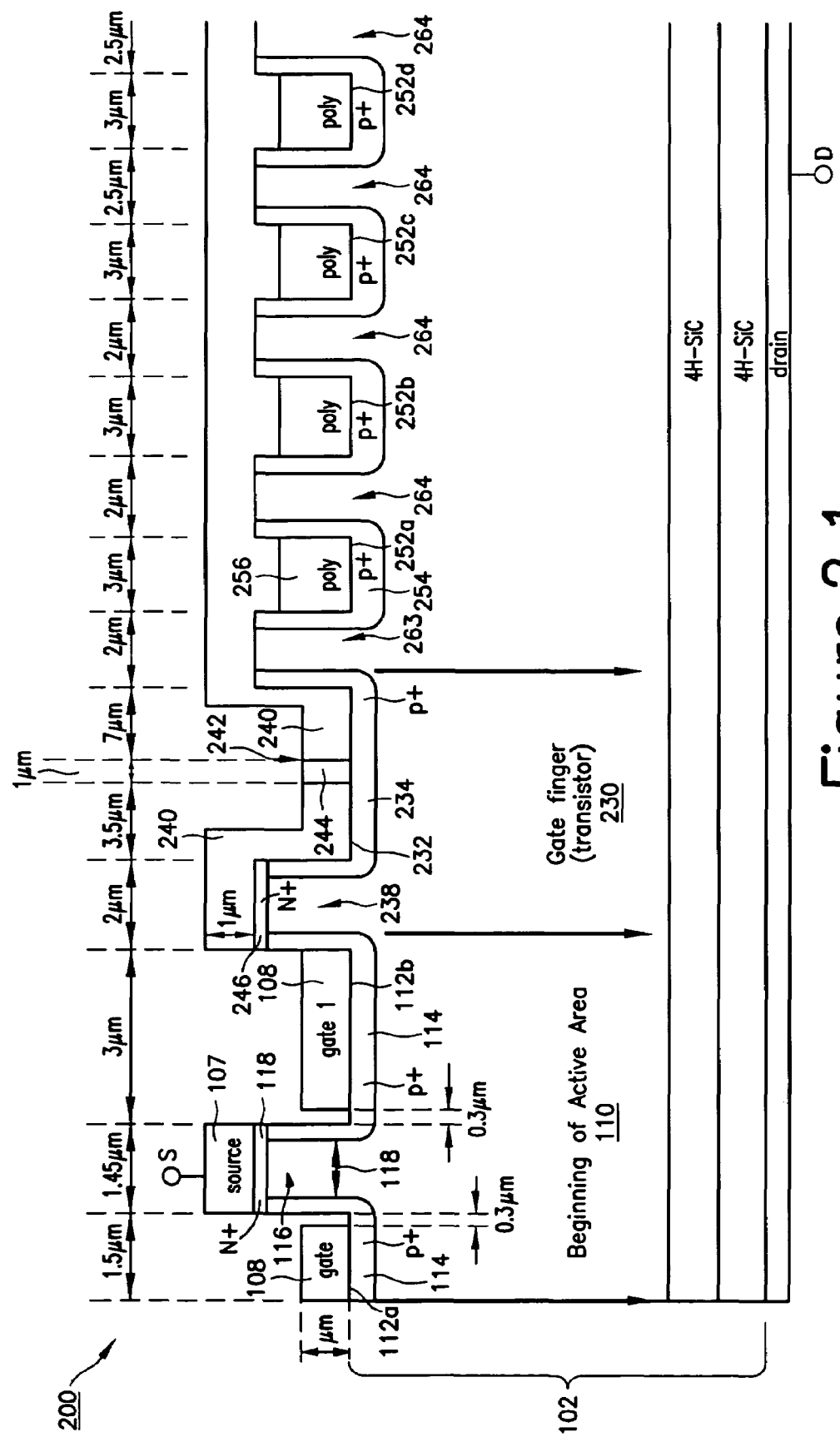
Figure 2.1

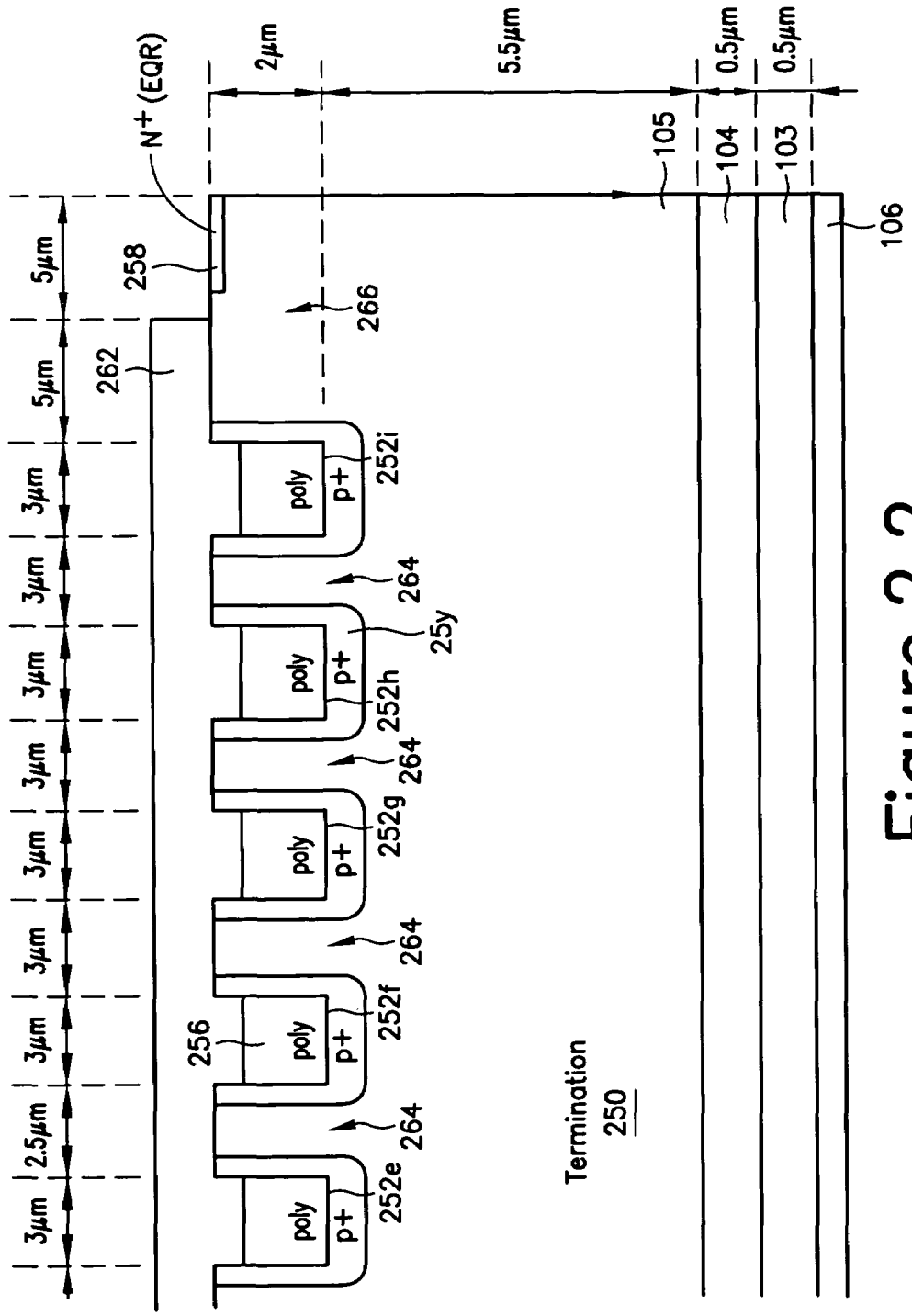
Figure 2.2

TERMINATION FOR SIC TRENCH DEVICES

RELATED APPLICATION

This application is based on and claims benefit of U.S. Provisional Application No. 60/658,789, filed on Mar. 4, 2005, entitled "TERMINATION FOR SiC TRENCH DEVICES," by Rossano Carta and Laura Bellemo and to which a claim of priority is hereby made and the disclosure of which is incorporated by reference.

BACKGROUND OF THE INVENTION

1. Field of the Invention

This invention relates generally to termination structures for semiconductor devices, and more specifically, to trench type terminations for silicon carbide semiconductor devices.

2. Description of the Prior Art

Silicon carbide (SiC) is becoming a mature technology for high power devices. For example, trench technologies are being applied to SiC to fabricate advanced trench type devices, such as JFET transistors and JBS rectifiers. With these advancements edge terminations for SiC power devices are a subject of significant interest for improving the blocking capability efficiency.

Many studies and patents have shown the use of field plate, guard ring, and JTE planar type terminations. However, in trench type devices, the epitaxially silicon depletion starts at the trench bottom, thereby making these planar type terminations inefficient. In addition, while the guard ring technique is well known in silicon technology, it has not been widely used in SiC technology due primarily to the difficulty in optimizing the ring spacing in SiC technology. For example, literature has reported achieving only about 50% of the ideal breakdown voltage using the guard ring technique. While the JTE technique is known to provide good termination efficiencies, this technique requires fabrication processes that are significantly more complex than that used for the guard ring and field termination techniques.

SUMMARY OF THE INVENTION

Accordingly, it is desirable to provide a termination for a trench type power SiC device that overcomes the above and other disadvantages of the prior art. According to an embodiment of the invention, a semiconductor device includes a SiC body having an active area and a termination region formed therein, the termination region defining the active area. The active area includes one or more trenches formed within the SiC body. The active area may be formed as any type of trench type device, such as a transistor or a rectifier (diode). According to a preferred embodiment of the invention, the semiconductor device is a JFET transistor. As a JFET transistor, for example, the device may also include a gate runner that extends around the outer periphery of the active area to connect the gate electrodes of the device.

According to an embodiment of the invention, the termination region is a trench type termination that extends around the outer periphery of the device and surrounds the gate runner (when present) and active area. According to one embodiment of the invention, the termination region includes a single trench that preferably extends to the same depth within the SiC body as the trenches formed in the active area. The termination region also includes a linking mesa region that extends around the inner sidewall of the termination trench and thereby links the termination region to the active area. Formed within the SiC body along the sidewalls and bottom surface of the termination trench is an implant region that forms a guard ring. Conductive bodies may be formed along the corners of the termination trench. A field insulation body extends along the top surface of the linking mesa region and covers the entire outer surface of the termination trench, thereby insulting the trench from contact and forming a floating trench.

According to an embodiment of the invention, the termination region may also include a metal field plate formed atop the field insulation body and that extends along a portion of the termination trench and outward beyond the outer sidewall of the trench. Although not required, the field plate is preferable in that it helps to prevent premature breakdown.

According to an embodiment of the invention, the field plate is insulated from the termination trench by the field insulation body and is shorted to an electrode of the device. According to another embodiment of the invention, the field plate is not shorted to an electrode but rather, is a floating field plate. Here, the field plate contacts the guard ring through an opening formed in the field insulation body.

According to an embodiment of the invention, the termination region may also include an equipotential ring (EQR) that acts as a channel stopper.

According to another embodiment of the invention, the termination region includes a plurality (i.e., two or more) of termination trenches that preferably extend to the same depth within the SiC body as the trenches formed in the active area. Each pair of adjacent trenches is separated by a mesa region. The termination region also includes a linking mesa region that links the termination region to the active area.

Formed within the SiC body along the sidewalls and bottom surface of each of the termination trenches is an implant region, thereby forming a plurality of guard rings. Formed within each of the termination trenches is a conductive body that fills a portion of the trench.

A field insulation body is disposed over each of the termination trenches and extends along the top surface of each mesa region between the trenches and along the top surface of the linking mesa region. As a result, the trenches are insulted from contact, thereby forming floating trenches.

According to an embodiment of the invention, the termination region preferably also includes a field plate formed atop the field insulation body, although again, this field plate is not required. According to an embodiment of the invention, the termination region may also include an EQR.

Advantageously, because the trench terminations of the present invention extend into the SiC body towards the same level as the active area trenches, the epitaxial silicon depletion that starts at the bottom of these trenches during blocking conditions is coordinated with and hooked-up by the termination at the same level as the active area trenches, thereby extending the depletion boundary. In addition, the fabrication processes for forming the trench terminations of the present invention may be similar to that used for forming the active area of the device. As such, the terminations do not require additional cost/process complications for fabrication Other features and advantages of the present invention will become apparent from the following description of the invention which refers to the accompanying drawings.

BRIEF DESCRIPTION OF THE DRAWINGS

FIG. 2 shows a cross sectional side view of a portion of the semiconductor device of FIG. 1A and in particular, shows an alternative termination region according to another embodiment of the invention.

DETAILED DESCRIPTION OF THE PREFERRED EMBODIMENTS

Figure 1A:
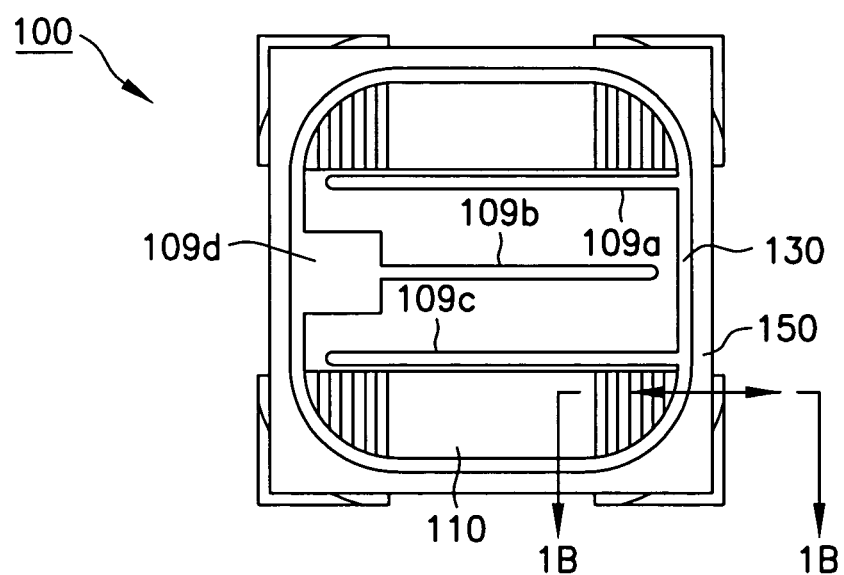
FIG. 1A shows a top view of a semiconductor device according to an embodiment of the invention.
Figure 1B:
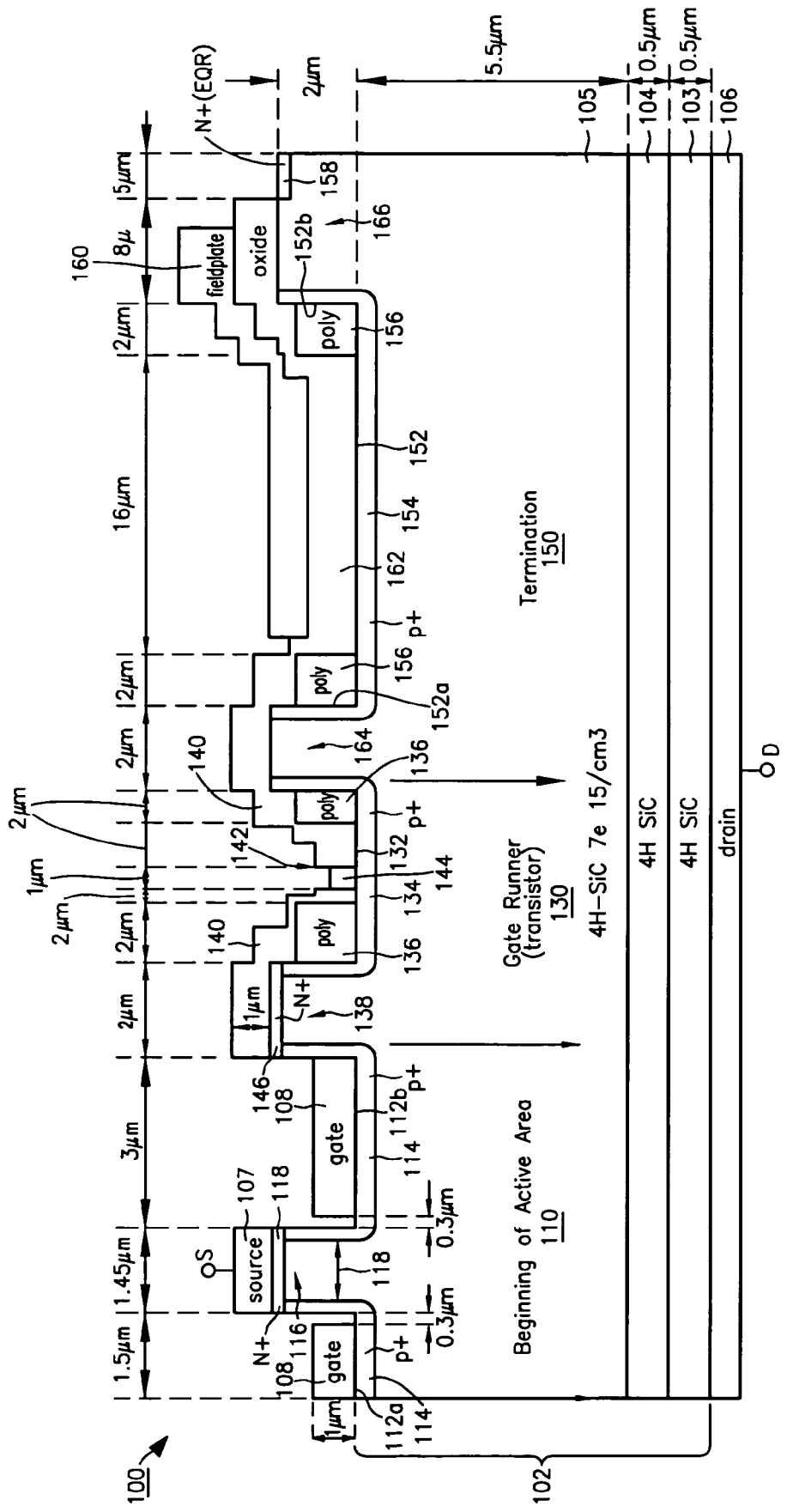
FIG. 1B shows a cross sectional side view of a portion of the semiconductor device of FIG. 1A and in particular, shows a termination region according to an embodiment of the invention.

Referring to FIGS. 1A and 1B, there is shown a top plan view of a SiC trench device 100 and a cross sectional side view of a portion of device 100 according to an embodiment of the invention (note that the dimensions shown in FIG. 1B are for example purposes only and that device 100 is not drawn to scale). In particular, device 100 includes a trench type termination region 150 according to an embodiment of the invention. Termination region 150 is suitable for high voltage blocking devices. According to a preferred embodiment of the invention, device 100 is a SiC JFET transistor. Nonetheless, trench termination 150 of the present invention is not limited to JFET transistors and may also be applied to other SiC trench devices including rectifiers (diodes) and transistors other than JFET transistors.

As shown in FIG. 1B, device 100 includes a SiC body 102, which may be N doped. As an example, body 102 includes a substrate 103, an epitaxially (Epi) buffer region 104, and an Epi drift layer 105, which may have a doping concentration of about $7E15/cm^3$. Formed along the top surface of body 102 is active area 110 and termination region 150, which extends around the outer periphery of device 100 and surrounds active area 110. Preferably, a gate runner/bus 130 may be disposed between active area 110 and termination region 150.

Active area 110 includes a plurality of gate trenches 112 formed within the top surface of body 102 and extending into Epi layer 105. A mesa region, such as region 116, is disposed between each adjacent pair of gate trenches. Formed on the top surface of each mesa region 116 is a conventional contact metal 107, such as aluminum, that forms a source electrode. Formed under source electrode 107 and within Epi layer 105 is a highly doped region 118 of N+ conductivity that forms an ohmic contact between the Epi layer and source electrode. As an example, region 118 may be doped with phosphorous at a concentration of about $2E19/cm^3$ and may have a thickness of about 0.5 um.

Each gate trench 112 has an implant region 114 of P+ conductivity that is formed within Epi layer 105 along the sidewalls and bottom surface of the trench. The doping concentration and thickness of implant region 114 along these two regions may vary. For example, region 114 may have a doping concentration of about $1E19/cm^3$ and a thickness of about 0.65 um along the trench bottom and may have a doping concentration of about $5E17/cm^3$ and a thickness of about 0.3 um along the trench sidewalls. Formed at the bottom of each gate trench 112 is a gate electrode 108 that is contacted by a metal electrode. As an example, gate electrodes 108 may be formed of P doped polysilicon, such as polysilicon doped with boron at a concentration of about 1E20. As shown, each gate electrode 108 may be spaced from the trench sidewall that forms mesa region 116.

Along the bottom surface of body 102 is a conventional contact metal 106 that forms a drain electrode.

Referring to FIG. 1A, gate runner 130 extends around the outer periphery of active area 110 and connects gate electrodes 108 to one another. Nonetheless, mechanisms other than gate runner 130 may be used to contact/connect the gate electrodes. Similarly, other transistor configurations may not require gate runner 130. One skilled in the art will also recognize that gate runner 130 is not present when the device is a rectifier, for example. When gate runner 130 is not present, active area 110 is directly linked to termination region 150.

As shown in FIG. 1B, gate runner 130 includes a single trench 132 formed within the top surface of body 102 and extending into Epi layer 105. Trench 132 may extend to the same depth into Epi layer 105 as gate trenches 112. Gate runner 130 also includes a mesa region 138 disposed between trench 132 and the outermost gate trench 112b of active area 110. Formed on the top surface of mesa region 138 and within Epi layer 105 is a highly doped region 146 of N+ conductivity. As an example, region 146 may be doped with phosphorous at a concentration of about $2E19/cm^3$ and may have a thickness of about 0.5 um. An implant region 134 of P+ conductivity is formed within Epi layer 105 along the sidewalls and bottom surface of trench 132. Implant region 134 may have the same doping concentration and thickness configuration along the trench sidewalls and bottom surface as implant region 114. Formed in each corner of trench 132, along a portion of the sidewalls and bottom surface, are conductive bodies 136. As an example, conductive bodies 136 may be P doped polysilicon and in particular, may be polysilicon doped with boron at a concentration of about 1E20. An insulation layer 140 formed of silicon dioxide ($SiO_2$), for example, is disposed over the bottom surface of trench 132 and over the top and side surfaces of conductive bodies 136, and extends along the top surface of mesa region 138 over doped region 146. As described below and as shown in FIG. 1B, insulation layer 140 is part of field insulation body 162 within termination region 150 and as such, may have a thickness consistent with that of field insulation body 162. An opening 142 is formed in insulation layer 140 down to the bottom surface of trench 132, thereby exposing implant region 134. A gate electrode 144 made of a metal, such as aluminum, is formed within opening 142 and contacts the gate electrodes 108 of the device.

As shown in FIG. 1A, gate runner 130 is connected to a gate contact 109 of device 100. Gate contact 109 may be configured as a pad 109d and a plurality of gate fingers 109a-109c. This configuration of a gate pad and gate fingers increases the contact area of the gate and reduces gate resistance, for example.

In general, the JFET transistor of device 100 operates as follows. A channel region 118 exists along each mesa region 116. To turn the device on and off, a bias voltage between gate electrode 109 and source electrode 107 is varied, thereby pinching/depleting channel region 118 and prohibiting the flow of current between drain electrode 106 and source electrode 107 or opening/undepleting channel region 118 and allowing a vertical conduction current to flow along the channel region between the electrodes.

Turning now to termination region 150, as shown in FIG. 1A, this region extends around the outer periphery of device 100 and surrounds gate runner 130 and active area 110. As shown in FIG. 1B, termination region 150 includes termination trench 152 formed within the top surface of body 102 and extending into Epi layer 105. Preferably, termination trench 152 extends to the same depth within Epi layer 105 as the trenches formed in active area 110, in this case, gate trenches 112. As an example, the gate trenches and termination trench may have a depth of about 2 um. The width of termination trench 152 may vary from about 5 um to about 100 um without affecting the blocking capability of device 100. Nonetheless, one skilled in the art will recognize that a smaller width for termination trench 152 allows for a larger active area 110 without having to change the size of device 100.

Termination region 150 also includes an end mesa region 166 and a linking mesa region 164. End mesa region 166 forms the outer sidewall 152b of the termination trench and extends towards the outer peripheral edge of device 100. Linking mesa region 164 forms the inner sidewall 152a of termination trench 152 and is thereby disposed between the termination trench and the active area, linking termination region 150 to the active area. As shown in FIG. 1B, when gate runner 130 is present, mesa region 164 forms the outer sidewall of trench 132. Alternatively, when gate runner 130 is not present, mesa region 164 forms the outer sidewall of the outermost trench of active area 110, in this case, gate trench 112b.

The width of mesa region 164 needs to be well targeted for ensuring the right potential spread along termination region 150. As an example, for a required blocking voltage of about 600V, the width of mesa region 164 is preferably about 2 um. Nonetheless, the width of mesa region 164 may vary from about 1 um to about 4 um depending on the required blocking voltage and the configuration of body 102, for example.

An implant region of P+ conductivity is formed within Epi layer 105 along the sidewalls and bottom surface of termination trench 152, thereby surrounding the trench with a P-N junction and forming guard ring 154. Guard ring 154 may have the same doping concentration and thickness configuration along the trench sidewalls and bottom surface as implant region 114 formed along gate trenches 112, as described above. Formed along the corners of trench 132, along a portion of the sidewalls and bottom surface, are conductive bodies 156. These conductive bodies may be P doped polysilicon and are residual formations resulting from the formation of conductive bodies 136, for example, and thereby have the same doping concentration as bodies 136. In general, conductive bodies 156 are not required but when present, do not affect the blocking capability of the device.

Termination region 150 also includes field insulation body 162 formed of silicon dioxide, for example. This insulation body is disposed over the bottom surface of trench 152 and over the top and side surfaces of conductive bodies 156 (when present), and extends along the top surface of mesa region 164 and along a portion of the top surface of mesa region 166. As shown, field insulation body 162 is integral with insulation layer 140 when gate runner 130 is present. Field insulation body 162 covers the entire outer surface of termination trench 152, thereby insulating the trench from contact and forming a floating trench. The thickness of field insulation body 162 may vary and in particular, is configured based on the required blocking voltage of the device. As an example, for a required blocking voltage of about 600V, field insulation body 162 is preferably about 1 um thick.

Termination region 150 may also include field plate 160 formed atop field insulation body 162. As shown, field plate 160 extends along a portion of termination trench 152 and outward beyond the outer sidewall 152b of the trench and over mesa region 166. Field plate 160 may be formed of aluminum, although other contact metals may be used. Although not required, field plate 160 is preferable in that it is useful for better spreading the depletion along termination region 150. More specifically, when field plate 160 is not present, a potential line crowding may form at the outer sidewall 152b of termination trench 152, thereby leading to a high spotty electric field and premature breakdown. Field plate 160 acts to spread the potential along this area. As an example, including field plate 160 in termination region 150 provides for about an 8% to 10% higher breakdown voltage. Preferably, field plate 160 has a minimum width of 5 um and may be increased depending on the required breakdown voltage of the device.

According to an embodiment of the invention, field plate 160 is insulated from termination trench 152 by field insulation body 162 and is shorted to either the source electrode or gate electrode of the device, thereby placing the field plate at the same potential as the source or gate. According to another embodiment of the invention, field plate 160 is not shorted to either the source or gate but rather, is a floating field plate. Here, field plate 160 contacts guard ring 154 through an opening formed in field insulation body 162. Preferably, one opening is formed in field insulation body 162 at each corner of device 100 to create this connection.

Termination region 150 may be ended by a highly doped region 158 of N+ conductivity formed within the top surface of Epi layer 105 along mesa region 166 along the outer peripheral edge of device 100. As an example, region 158 may be phosphorous doped at a concentration of about $2E19/cm^3$ and may have a thickness of about 0.5 um. Region 158 functions as an equipotential ring (EQR), or in other words, as a channel stopper. Nonetheless, this channel stop function is not as critical as in silicon devices and as such, EQR 158 is not required.

One skilled in the art will recognize that by varying the width of mesa region 164, the thickness of field insulation layer 162, and the thickness of field plate 160, for example, termination region 150 may be adapted to devices that require blocking voltages other than 600V.

Referring now to FIG. 2, there is shown a cross sectional side view of a portion of a device 200 according to another embodiment of the invention (note that the dimensions shown in FIG. 2 are for example purposes only and that device 200 is not drawn to scale). Device 200 includes an alternative trench termination 250 according to another embodiment of the invention. According to a preferred embodiment of the invention, device 200 is a SiC JFET transistor and resembles device 100 as shown in FIGS. 1A and 1B except for the difference in terminations. Note that FIG. 2 shows the same cross sectional view as FIG. 1B. (Note that like reference numerals between FIGS. 1A, 1B, and 2 refer to similar elements.) One skilled in the art will again recognize that while trench termination 250 is described in combination with a JFET transistor, termination 250 may also be applied to other SiC trench devices, including rectifiers and transistors other than JFET transistors.

As shown in FIG. 2, device 200 includes a SiC body 102 that has an active area 110, gate runner/bus 230, and termination region 250 formed therein. Active area 110 is as described above. Gate runner 230 is similar to gate runner 130 and extends around the outer periphery of active area 110, connecting the gate electrodes 108 of the device to a common gate contact 109. Again, mechanisms other than gate runner 230 may be used to contact/connect the gate contacts and gate runner 230 is not required, such as when the device is a rectifier, for example. When gate runner 230 is not present, active area 110 is directly linked to termination region 250.

As shown in FIG. 2, gate runner 230 includes a single trench 232 that may extend to the same depth into Epi layer 105 as gate trenches 112. Gate runner 230 also includes a mesa region 238 disposed between trench 232 and the outermost gate trench 112b of active area 110. Formed along the top surface of mesa region 238 within Epi layer 105 is a highly doped region 246 of N+ conductivity. As an example, region 246 may be phosphorous doped at a concentration of about $2E19/cm^3$ and may have a thickness of about 0.5 um. An implant region 234 of P+ conductivity is formed within Epi layer 105 along the sidewalls and bottom surface of trench 232. Again, the doping concentration and thickness configuration of implant region 234 may vary along the trench sidewalls and bottom surface as similarly described above and in particular, may resemble the configuration of implant region 114 formed along gate trenches 112. An insulation layer 240 formed of silicon dioxide, for example, is disposed over the sidewalls and bottom surface of trench 232 and extends along the top surface of mesa region 238. Similar to above, insulation layer 240 is part of field insulation body 262 within termination region 250 and as such, may have a thickness consistent with that of field insulation body 262. An opening 242 is formed in insulation layer 240 down to the bottom surface of trench 232, thereby exposing implant region 234. A gate electrode 244 made of a metal, such as aluminum, is formed within opening 242 and contacts the gate electrodes 108 of the device.

Turning now to termination region 250, similar to termination region 150, this region extends around the outer periphery of device 200 and surrounds gate runner 230 and active area 110. As shown in FIG. 2, termination 250 includes a plurality (i.e., two or more) of termination trenches 252a-i formed within the top surface of body 102 and extending into Epi layer 105. Each pair of adjacent trenches is separated by a mesa region 264. Preferably, termination trenches 252 extend to the same depth within Epi layer 105 as the trenches formed in active area 110, in this case, gate trenches 112. As an example, the termination and gate trenches may have a depth of about 2 um. The width of termination trenches 252 may vary and does not affect the blocking capability of device 200. In general, the trench width is largely determined by the available technology used to form the trenches. As an example, trenches 252 may have a width of about 3 um. Overall, the number of termination trenches may vary and in particular, is configured based on the desired voltage to be blocked, as well as the width of mesa regions 264. Note that each of mesa regions 264 may have substantially the same width, or the widths may vary among the mesa regions.

Termination region 250 also includes end mesa region 266 and linking mesa region 263. End mesa region 266 forms the outer sidewall of the outermost termination trench 252i and extends towards the outer peripheral edge of device 200. Linking mesa region 263 forms the inner sidewall of the innermost termination trench 252a and is thereby disposed between the termination trenches and the active area, linking termination region 250 to the active area. As shown in FIG. 2, when gate runner 130 is present, mesa region 263 forms the outer sidewall of trench 232. Alternatively, when gate runner 230 is not present, mesa region 263 forms the outer sidewall of the outermost trench of active area 110, in this case, gate trench 112b.

The width of mesa region 263 needs to be well targeted for ensuring the right potential spread along termination region 250. For example, for a required blocking voltage of about 600V, the width of mesa region 263 is preferably about 2 um. Nonetheless, the width of mesa region 263 may vary and may wider than 2 um, for example, depending on the required blocking voltage and the configuration of body 102, for example.

An implant region of P+ conductivity is formed within Epi layer 105 along the sidewalls and bottom surface of each of the termination trenches 252, thereby surrounding each trench with a P-N junction and forming a plurality of guard rings 254. Again, the doping concentration and thickness configuration of each guard ring 254 may vary along the trench sidewalls and bottom surface as similarly described above and in particular, may resemble the configuration of implant region 114 formed along gate trenches 112, as described above.

Formed within each of the termination trenches 252 is a conductive body 256 that fills a portion of the trench. These conductive bodies may be P doped polysilicon and in particular, may be polysilicon doped with boron at a concentration of about 1E20, for example. Nonetheless, similar to termination trench 152, termination trenches 252 are insulated and thereby floating, as discussed below. Accordingly, trench bodies 256 may be formed from other materials, including an oxide, such as silicon dioxide.

Termination region 250 also includes field insulation body 262 formed of silicon dioxide, for example. This insulation body is disposed over each of the termination trenches 252, filling the remaining portion of each trench, and extends along the top surface of mesa region 263, along the top surfaces of mesa regions 264, and along a portion of the top surface of mesa region 266. As shown, field insulation body 262 is integral with insulation layer 240 when gate runner 230 is present. Field insulation body 262 covers the entire outer surface of termination trenches 252, thereby insulating the trenches from contact and forming floating trenches. The thickness of field insulation body 262 may vary from about 5000 A to several microns and in particular, is configured based on the required blocking voltage of the device. As an example, for a required blocking voltage of about 600V, field insulation body 162 is preferably about 1 um thick.

Similar to termination region 150, termination region 250 may also include a field plate (not shown in FIG. 2) formed atop field insulation body 262. This field plate extends along a portion of termination region 250 and outward beyond the outer sidewall of the outermost termination trench 252i and over mesa region 266. The field plate may be formed of aluminum, although other contact metals may be used. Similar to field plate 160, the field plate of termination region 250 is not required but is preferred in that it provides for a higher breakdown voltage as compared to when the field plate is not included.

Similar to field plate 160, the field plate of termination region 250 may be insulated from the termination trenches by field insulation body 262 and shorted to either the source electrode or gate electrode of the device.

Termination region 250 may also include an N+ doped EQR 258 formed along mesa region 266 along the outer peripheral edge of device 200, which EQR functions as a channel stopper. As an example, region 258 may be phosphorous doped at a concentration of about $2E19/cm^3$ and may have a thickness of about 0.5 um.

Similar to termination region 150, one skilled in the art will recognize that termination region 250 may be adapted to devices that require blocking voltages other than 600V by varying, for example, the width of mesa region 263, the thickness of field insulation layer 262, and the number of termination trenches 252.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
    a silicon carbide body having first and second opposing major surfaces;
    an active area formed along said first major surface of said silicon carbide body;

a termination region formed along said first major surface of said silicon carbide body and defining said active area, said termination region including a termination trench formed within said silicon carbide body and having sidewalls and a bottom surface;

a guard ring formed within said silicon carbide body along said sidewalls and said bottom surface of said termination trench; and a field insulation body covering said sidewalls and said bottom surface of said termination trench, wherein a portion of said field insulation body is in contact with said bottom of said termination trench.

2. The semiconductor device of claim 1, further comprising a field plate disposed over said field insulation body, wherein said field plate is separate from said field insulation body.

3. The semiconductor device of claim 2, wherein said field plate extends beyond an outer sidewall of said termination trench.

4. The semiconductor device of claim 2, wherein said field plate is floating.

5. The semiconductor device of claim 4, wherein said field insulation body has an opening formed therein and wherein said field plate extends through said opening and contacts said guard ring.

6. The semiconductor device of claim 2, wherein said field plate is shorted to an electrode of said device.

7. The semiconductor device of claim 1, wherein said termination region further includes a mesa region disposed between said termination trench and said active area, said mesa region linking said termination region to said active area.

8. The semiconductor device of claim 7, wherein said field insulation body extends over a top surface of said mesa region.

9. The semiconductor device of claim 1, wherein said termination region further includes an EQR ring formed along an outer peripheral edge of said device.

10. The semiconductor device of claim 1, wherein said active area includes at least one trench formed within said silicon carbide body.

11. The semiconductor device of claim 10, wherein said termination trench and said at least one trench of said active area extend to about a same depth within said silicon carbide body.

12. The semiconductor device of claim 1, further comprising a conductive body disposed within said termination trench under said field insulation body.

13. The semiconductor device of claim 12, wherein said conductive body is doped polysilicon.

14. The semiconductor device of claim 1, wherein said semiconductor device is a transistor JFET.

15. The semiconductor device of claim 14, further comprising a gate runner disposed between said termination trench and said active area.

16. The semiconductor device of claim 1, wherein said termination region includes a plurality of termination trenches formed within said silicon carbide body, each termination trench having sidewalls and a bottom surface and being spaced from an adjacent termination trench by a mesa region.

17. The semiconductor device of claim 16, wherein each of said plurality of termination trenches includes a guard ring formed within said silicon carbide body along said sidewalls and said bottom surface of said termination trench.

18. The semiconductor device of claim 17, wherein said field insulation body covers each of said plurality of termination trenches.

19. The semiconductor device of claim 18, further comprising a field plate disposed over said field insulation body.

20. The semiconductor device of claim 18, further comprising a conductive body disposed within each of said termination trenches and under said field insulation body.

21. The semiconductor device of claim 20, wherein said conductive bodies are doped polysilicon.

22. The semiconductor device of claim 18, wherein said termination region further includes a linking mesa region that links said termination region to said active area.

23. The semiconductor device of claim 18, wherein said termination region further includes an EQR ring formed along an outer peripheral edge of said device.

24. The semiconductor device of claim 16, wherein said active area includes at least one trench formed within said silicon carbide body.

25. The semiconductor device of claim 24, wherein each of said termination trenches and said at least one trench of said active area extend to about a same depth within said silicon carbide body.

26. The semiconductor device of claim 16, wherein said semiconductor device is a transistor JFET.

* * * * *